United States Patent
Zhang et al.

(10) Patent No.: US 8,014,986 B2
(45) Date of Patent: Sep. 6, 2011

(54) FINITE DIFFERENCE ALGORITHM FOR SOLVING LUBRICATION EQUATIONS WITH SOLUTE DIFFUSION

(75) Inventors: Jie Zhang, Santa Clara, CA (US); Jiun-Der Yu, Sunnyvale, CA (US); Shinri Sakai, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 298 days.

(21) Appl. No.: 12/476,588

(22) Filed: Jun. 2, 2009

(65) Prior Publication Data
US 2010/0305914 A1 Dec. 2, 2010

(51) Int. Cl.
G06G 7/48 (2006.01)
G06F 17/10 (2006.01)

(52) U.S. Cl. ................................... 703/9; 703/2

(58) Field of Classification Search ............ 703/2, 9
See application file for complete search history.

(56) References Cited

U.S. PATENT DOCUMENTS

| | | | |
|---|---|---|---|
| 6,391,986 B1 | 5/2002 | Goode et al. | |
| 6,471,761 B2 | 10/2002 | Fan et al. | |
| 6,660,209 B2 | 12/2003 | Leyden et al. | |
| 6,754,551 B1 | 6/2004 | Zohar et al. | |
| 6,913,832 B2 | 7/2005 | Fan et al. | |
| 7,022,534 B2 | 4/2006 | Gupta et al. | |
| 7,085,695 B2 | 8/2006 | Yu et al. | |
| 7,117,138 B2 | 10/2006 | Yu et al. | |
| 7,147,306 B2 | 12/2006 | Silverbrook et al. | |
| 7,160,633 B2 | 1/2007 | Tai et al. | |
| 7,169,989 B2 | 1/2007 | Marks et al. | |
| 7,176,040 B2 | 2/2007 | Sirringhaus et al. | |
| 7,813,907 B2 * | 10/2010 | Zhang et al. | 703/9 |
| 7,899,654 B2 * | 3/2011 | Zhang et al. | 703/2 |
| 7,930,155 B2 * | 4/2011 | Zhang et al. | 703/9 |
| 2005/0052120 A1 | 3/2005 | Gupta et al. | |
| 2006/0120213 A1 * | 6/2006 | Tonkovich et al. | 366/144 |
| 2007/0043544 A1 | 2/2007 | Song et al. | |
| 2007/0136042 A1 | 6/2007 | Yu | |
| 2007/0170058 A1 * | 7/2007 | Lee et al. | 204/450 |
| 2007/0239414 A1 | 10/2007 | Song et al. | |
| 2007/0250296 A1 | 10/2007 | Shima et al. | |
| 2008/0126046 A1 * | 5/2008 | Yu | 703/9 |
| 2010/0250203 A1 * | 9/2010 | Zhang et al. | 703/2 |

FOREIGN PATENT DOCUMENTS

| | | |
|---|---|---|
| EP | 0 765 236 B1 | 7/1999 |
| EP | 1 208 985 A2 | 5/2002 |
| JP | 10-256330 | 9/1998 |

OTHER PUBLICATIONS

Braun et al, T. Contactless Component Handling on PCB Using EWOD Principles, IEEE, Electronics Packaging Technology Conference, 2008, pp. 186-192.*
Bonn, D., et al., Wetting and Spreading, Review of Modern Physics, vol. 81, Apr.-Jun. 2009, pp. 739-805.

(Continued)

*Primary Examiner* — Russell W Frejd

(57) ABSTRACT

A computer implemented method for simulating a final pattern of a droplet of a fluid having a plurality of fluid properties is disclosed. The method includes using lubrication equations to represent solute flow, diffusion and evaporation of a droplet on a substrate. The method further includes solving the lubrication equations through temporal discretization and spatial discretization; and deriving the final pattern of the droplet from results of the solving. The final pattern is stored on a computer readable medium.

14 Claims, 9 Drawing Sheets

OTHER PUBLICATIONS

Tseng, F.G., et al., "A High-Resolution High-Frequency Monolithic Top-Shooting Microinjector Free of Satellite Drops-Part I: Concept, Design, and Model", Journal of Microelectromechanical Systems, vol. 11, No. 5, Oct. 2002, pp. 427-436.

Pasandideh-Fard, M., et al., "A three-dimensional model of droplet impact and solidification", International Journal of Heat and Mass Transfer 45, 2002, pp. 2229-2242.

Hu, H., et al., "Analysis of the Microfluid Flow in an Evaporating Sessile Droplet", Langmuir 2005, 21, pp. 3963-3971.

Hu, H., et al., "Analysis of the Effects of Marangoni Stresses on the Microflow in an Evaporating Sessile Droplet", Langmuir 2005, 21, pp. 3972-3980.

Deegan, R., et al., "Capillary flow as the cause of ring stains from dried liquid drops", Nature, vol. 389, Oct. 1997, pp. 827-829.

Deegan, R., et al., "Capillary flow as the cause of ring stains from dried liquid drops", James Franck Institute, Chicago, IL, Jul. 15, 1997, pp. 1-4.

Popov, Y.O., et al., "Characteristic Angles in the Wetting of an Angular Region: Deposit Growth", Department of Physics, University of Chicago, Jun. 6, 2003, pp. 1-36.

Deegan, R., et al., "Contact line deposits in an evaporating drop", Physical Review E., vol. 62, No. 1, Jul. 2000, pp. 756-765.

Sultan, E., et al., "Diffusion-limited evaporation of thin polar liquid films", Journal of Engineering Mathematics 50: 2004, pp. 209-222.

Widjaja, E., et al., "Dynamics of sessile droplet evaporation: a comparison of the spine and the elliptic mesh generation methods", Elsevier, Computers & Chemical Engineering 31, 2007, pp. 219-232.

Guena, G., et al., "Evaporation of sessile liquid droplets", Elsevier, Colloids and Surfaces A: Physicochem Eng. Aspects 291, 2006, pp. 191-196.

Hu, H., et al., "Evaporation of a Sessile Droplet on a Substrate", J. Phys. Chem. B, 2002, 106, pp. 1334-1344.

Schunk, P.R., et al., "Finite element modeling of evaporation and condensation during sol-gel film and fiber formation", VIII International Conference on Finite Elements in Fluids, Barcelona, Spain Sep. 20-24, 1993, pp. 1-12.

de Gans, Berend-Jan, et al., "Inkjet Printing of Polymers: State of the Art and Future Developments", Advanced Materials, 2004, 16, No. 3, Feb. 3, pp. 203-213.

Chernyak, V., "The Kinetic Theory of Droplet Evaporation", J. Aerosol Sci., vol. 26, No. 6, pp. 873-885, 1995.

Widjaja, E., et al., "Numerical study of vapor phase-diffusion driven sessile drop evaporation", Elsevier, Computers & Chemical Engineering 32, 2008, pp. 2169-2178.

Bayada, G., et al., "On a free boundary problem for the Reynolds equation derived from the Stokes system with Tresca boundary conditions" Journal of Mathematical Analysis and Applications, J. Math. Anal. Appl. 282, 2003, pp. 212-231.

Deegan, R., "Pattern formation in drying drops", Physical Review E, vol. 61, No. 1, Jan. 2000, pp. 475-485.

Percin, G., et al., "Piezoelectric droplet ejector for ink-jet printing of fluids and solid particles", Review of Scientific Instruments, vol. 74, No. 2, Feb. 2003, pp. 1120-1127.

Tarasevich, Y., "Simple analytical model of capillary flow in an evaporating sessile drop", Physical Review E 71, 027301, 2005, pp. 1-3.

Decent, S.P., "The spreading of a viscous microdrop on a solid surface", Microfluid Nanofluid, 2006, 2: 537-549.

Schwartz, L.W., "Theoretical and Numerical Modeling of Coating Flow on Simple and Complex Substrates including Rheology, Drying and Marangoni Effects", Advances in Coating and Drying of Thin Films, 1999, pp. 1-24.

Chen, C, et al., "Uniform Solute Deposition of Evaporable Droplet in Nanoliter Wells", Journal of Microelectromechanical Systems, vol. 16, No. 5, Oct. 2007, pp. 1209-1218.

Ozawa, K, et al., "Modeling of the Drying Process of Liquid Droplet to Form Thin Film", Japanese Journal of Applied Physics, vol. 44, No. 6A, 2005, pp. 4229-4234.

Fischer, B., "Particle Convection in an Evaporating Colloidal Droplet", Langmuir 2002, 18, pp. 60-67.

Liou, M., "A Generalized Procedure for Constructing an Upwind-Based TVD Scheme", 25th Aerospace Sciences Meeting, Jan. 12-15, 1987, pp. 1-27.

Harten, Ami, et al., "Uniformly High Order Accurate Essentially Non-Oscillatory Schemes III", Institute for Computer Applications in Science and Engineering NASA, Apr. 1986, pp. 1-99.

* cited by examiner

FINITE DIFFERENCE ALGORITHM FOR SOLVING LUBRICATION EQUATIONS WITH SOLUTE DIFFUSION

CROSS-REFERENCE TO RELATED APPLICATIONS

The present application is related to U.S. patent application Ser. No. 12/411,810, filed on Mar. 26, 2009, entitled "A Finite Element Algorithm for Solving a Fourth Order Nonlinear Lubrication Equation for Droplet Evaporation", which is hereby incorporated by reference in its entirety.

BACKGROUND

1. Field of Invention

The present application is directed towards systems and method for simulating the evaporation of a droplet.

2. Description of the Related Art

Applying inkjet technology to the industrial printing process can greatly improve its efficiency. Inkjet technology can be used to save energy, material, money, and it can also help improve the environment. Inkjet technology may be used to make liquid crystal displays (LCD), thin film transistors (TFT), organic light emitting diodes (OLED), solar cells, micro-circuits, and other planar, layered, and 3-D structures. In the inkjet printing process, small droplets of a solution containing a solute with the desired properties and a solvent to make the solution jettable are deposited on to the target area. After the droplets reach the targeted area, the solvent evaporates and only the solute is left to form a final print pattern. The final pattern of the deposited solute directly determines the quality of the desired product.

In order to improve the quality of the final product, it is desirable to understand how the final pattern is formed in a realistic environment, what are the major factors affecting the final pattern, and how to control the production parameters in order to achieve a final product with the desired quality. In the final stage of ink drying process, the aspect ratio of length to height becomes quite large. Consequently, it is difficult to use traditional direct simulation methods to simulate the whole process. Lubrication equations may be applied to describe such phenomenon, however, the application of the lubrication equations have been limited to flat surfaces.

The present invention is directed towards addressing the problem of solving lubrication equations on a non-flat surface.

SUMMARY OF INVENTION

An embodiment of the present invention may be a system or method for simulating the drying pattern of a droplet.

An embodiment of the present invention may be a computer-readable medium encoded with instructions for a processor to perform a method for simulating a final pattern of a droplet of a fluid. The computer readable medium may include instructions for describing the behavior of the fluid using lubrication equations that describe behavior of the droplet on a non-flat substrate. The computer readable medium may include instructions for using the lubrication equations to represent diffusion in the droplet and evaporation of the droplet. The computer readable medium may include instructions for solving the lubrication equations through temporal discretization and spatial discretization. The computer readable medium may include instructions for deriving the final pattern of the droplet from results of the solving of the lubrication equations. The computer readable medium may include instructions for storing the final pattern.

In an embodiment of the present invention the lubrication equations further represent diffusion of a solute in a solvent. In an embodiment of the present invention the droplet is axi-symmetric. In an embodiment of the present invention solving the lubrication equations is achieved through a central difference expression.

In an embodiment of the present invention evaporation in the droplet is calculated using a first high order differential function that is representative of the behavior of a height of the droplet over time. A first function is representative of a temporal derivative of a height (H) of the droplet above a plane. The first function is equated to a second function. The second function includes a first term that is a function of the height (H-f) of the droplet above a substrate (f) and a Laplacian of the height ($\nabla^2 H$) of the droplet above the plane. The second function includes a second term that is representative of the evaporation rate of the droplet.

In an embodiment of the present invention the diffusion in the droplet is calculated using a second high order differential function that is representative of the behavior of a concentration (C) of solute in the droplet. The second high order differential function includes a temporal derivative of the product of a height of the droplet above the substrate and the concentration ((H-f)C) that is equated to a sum of a third function and a fourth function. The third function is a differential function of a product of: the concentration (C); the height of the droplet above the substrate (H-f); and a third high order differential function of the height of the droplet (H) above a plane. The fourth function is a differential function of a product of: a differential function of the concentration (C); and the height of the droplet above the substrate (H-f).

An embodiment of the present invention is a system including a processor for performing a simulation of the final pattern of a droplet. An embodiment of the present invention includes preparing a fluid in response to the results of a simulation of the final pattern of the droplet.

An embodiment of the present invention is a computer-readable medium encoded with instructions for a processor to perform a method for simulating the evolution of a height of an evaporating droplet. The simulation includes generating a height function that is representative of the height (H) of the droplet above a plane at a first point in time at a plurality of points in a simulation space. The simulation includes generating a first differential function that describes a proportional relationship between an intermediate variable and a Laplacian of the height function ($\nabla^2 H$).

The simulation includes generating a second differential function. The second differential function includes a first term that is a partial derivative of the height (H) function with respect to time. The second differential function includes a second term that is proportional to the evaporation rate (J) of the droplet. The second differential function includes a third term that is a third function of the height function (H), a height of a non-flat substrate (f) on which the droplet is located, and the intermediate variable.

The simulation includes determining the height function at a second point in time by finding an approximate solution that satisfies both the first differential function and the second differential function. In an embodiment of the present invention the third function is the divergence of a fourth function of the height and the intermediate variable. In an embodiment of the present invention the fourth function is proportional to the cube of the difference between the height function and a height of a non-flat substrate (H-f). In an embodiment of the present invention fourth function is proportional to the gradient of the intermediate variable.

In an embodiment of the present invention the evaporation rate (J) of the droplet is a function of space and time. An embodiment of the present invention is a method of manufacturing that includes evaporating droplets on a substrate, wherein the manufacturing method is adjusted based on the results of simulating the evolution of the height of an evaporating droplet. An embodiment of the present invention includes preparing a fluid in response to the results of a simulation.

Other aspects and advantages of the present invention will become apparent from the following detailed description, taken in conjunction with the accompanying drawings, illustrating by way of example the principles of the present invention. Other objects and attainments together with a fuller understanding of the invention will become apparent and appreciated by referring to the following description and claims taken in conjunction with the accompanying drawings.

BRIEF DESCRIPTION OF THE DRAWINGS

The present invention can be best understood by reference to the following description taken in conjunction with the accompanying figures, in which like parts may be referred to by like numerals.

DESCRIPTION OF THE PREFERRED EMBODIMENTS

The present invention relates to systems and methods for simulating the evolution of a droplet drying on a substrate. In an embodiment of the present invention the droplet may be produced using inkjet technology. The present invention may be used to simulate the evolution of droplets produced using other techniques without going beyond the spirit and scope of the present invention.

Inkjet technology is conventionally used to print ink on paper. However, a tremendous amount of resources can be saved by applying inkjet technology to other fabrication processes, such as semiconductor fabrication processes, LCD fabrication processes, TFT fabrication processes, OLED fabrication processes, solar cell fabrication processes, etc. In the inkjet printing process, small droplets of a solution containing a solute with the desired properties and a solvent are deposited onto the target area. After the droplets reach the targeted area, the solvent evaporates and only the solute is left forming a final print pattern. The final pattern of the solute deposit directly determines the desired product quality. An individual skilled in the art will appreciate that the present invention may be applied to any droplet drying on a non-flat substrate. The targeted area on which the droplet is deposit may be a flat substrate or a non-flat substrate.

Figure 1:
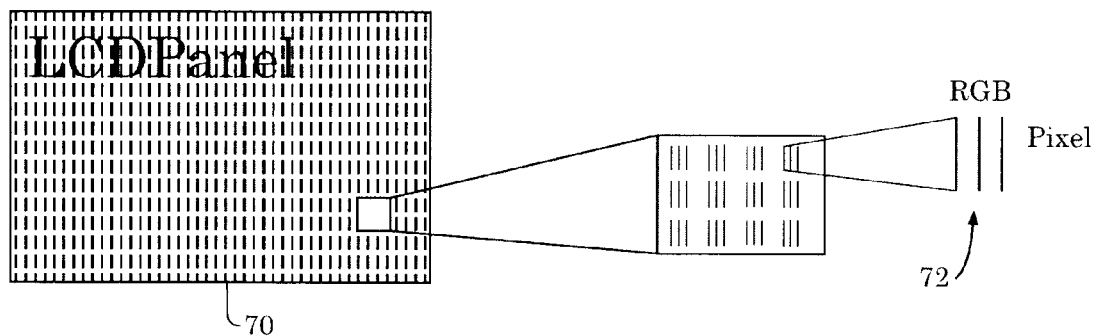
FIG. 1 illustrates an exemplary application of inkjet printing technology.

FIG. 1 is an illustration of an LCD panel 70, which is an exemplary product that can be produced using an industrial printing process such as inkjet printing technology. In an embodiment of the present invention, inkjet printing technology is used to fabricate the LCD panel 70. Traditionally, LCD panels 70 are fabricated using CMOS fabrication technology requiring several processing steps such as masking, deposition, unmasking, etc., to fabricate Red (R), Green (G), and Blue (B) filters 72 on a non-uniform substrate. Each color is made from a different material, and in the traditional fabrication method requires three separate processing steps.

Using inkjet technology, filters made from different materials may all be printed in a single step. Inkjet technology creates images and objects using small droplets of fluid. The inkjet printing head deposits small droplets in a desired pattern on a substrate. Until the droplets dry, the shapes of these droplets change continuously due to evaporation, surface tension, and other properties of the fluid and substrate. Therefore, the final pattern of the drops may change into a shape and size that is not desirable. For example, in LCD fabrication, if droplets for red filters and green filters are printed too far away from each other, a lower LCD resolution will result. However, if these droplets are placed too close, the drops may overlap when dried. It is also important to control the consistency and uniformity of the color of the filters which is controlled by their thickness and density. Therefore, it is important to simulate the final pattern of a drop in order to proceed with confidence that the end product will be acceptable.

In an embodiment of the simulation, the simulation of the final shape of the droplet can be repeated several times while adjusting the fluid properties of the droplet until a desired final shape is obtained. It should be noted that FIG. 1 simply illustrates one of many uses of the inkjet technology in industrial applications.

Although simulations in a rectangular domain provide some insights into achieving a desired final pattern, in a realistic setup, the droplet is often located in a more complex bank structure. One technique for addressing this challenge is disclosed in application Ser. No. 12/043,867, filed on Mar. 6, 2008 (AP341), which is incorporated by reference for all purposes.

In the embodiments described herein a new finite difference algorithm for solving the lubrication equations for the evolution of both the interface shape and the solute concentration is provided. In an embodiment of the present invention the technique described herein is used to solve the solute equation with diffusion. The technique is unique in that it can also accommodate a complex bank structure as well as a varying viscosity for the solvent.

Governing Equations

Initially, a liquid drop on a flat substrate with a pinned contact line is considered. The contact line may be represented by one or more points. The contact line may be represented by a series of points. Symmetry may be used to reduce the number of points that are used to represent the contact line. This is a reasonable assumption under many conditions. In a cylindrical coordinate system (r*,θ*,z*), the velocities $\vec{v}^* = (v_r^*, v_\theta^*, v_z^*)$ satisfy the Navier-Stokes equations described in equations (1)-(3). The superscript * refers to fully dimensioned variables as opposed to dimensionless variables.

$$\rho^*\left(\frac{\partial v_r^*}{\partial t^*} + v_r^* \frac{\partial v_r^*}{\partial r^*} + \frac{v_\theta^*}{r^*}\frac{\partial v_r^*}{\partial \theta^*} - \frac{v_\theta^{*2}}{r^*} + v_z^*\frac{\partial v_r^*}{\partial z^*}\right) = \tag{1}$$
$$-\frac{\partial p^*}{\partial r^*} + \left[\frac{1}{r^*}\frac{\partial}{\partial r^*}(r^* \tau_{rr}^*) + \frac{1}{r^*}\frac{\partial \tau_{\theta r}^*}{\partial \theta^*} + \frac{\partial \tau_{zr}^*}{\partial z^*} - \frac{\tau_{\theta\theta}^*}{r^*}\right]$$

$$\rho^*\left(\frac{\partial v_\theta^*}{\partial t^*} + v_r^* \frac{\partial v_\theta^*}{\partial r^*} + \frac{v_\theta^*}{r^*}\frac{\partial v_\theta^*}{\partial \theta^*} + \frac{v_r^* v_\theta^*}{r^*} + v_z^*\frac{\partial v_\theta^*}{\partial z^*}\right) = \tag{2}$$
$$-\frac{1}{r^*}\frac{\partial p^*}{\partial \theta^*} + \left[\frac{1}{r^{*2}}\frac{\partial}{\partial r^*}(r^{*2} \tau_{r\theta}^*) + \frac{1}{r^*}\frac{\partial \tau_{\theta\theta}^*}{\partial \theta^*} + \frac{\partial \tau_{\theta z}^*}{\partial z^*} + \frac{\tau_{r\theta}^* - \tau_{\theta r}^*}{r^*}\right]$$

$$\rho^*\left(\frac{\partial v_z^*}{\partial t^*} + v_r^* \frac{\partial v_z^*}{\partial r^*} + \frac{v_\theta^*}{r^*}\frac{\partial v_z^*}{\partial \theta^*} + v_z^*\frac{\partial v_z^*}{\partial z^*}\right) = \tag{3}$$
$$-\frac{\partial p^*}{\partial z^*} + \left[\frac{1}{r^*}\frac{\partial}{\partial r^*}(r^* \tau_{rz}^*) + \frac{1}{r^*}\frac{\partial \tau_{\theta z}^*}{\partial \theta^*} + \frac{\partial \tau_{zz}^*}{\partial z^*}\right]$$

The fluid density ρ*, viscosity μ*, pressure p*, and velocities $\vec{v}^*$ are dimensional variables. The components of stress tensor τ* used in equations (1)-(3) are described in equations (4)-(9).

$$\tau_{rr}^* = \mu^*\left(2\frac{\partial v_r^*}{\partial r^*} - \frac{2}{3}\nabla \cdot \vec{v}^*\right) \tag{4}$$

$$\tau_{\theta\theta}^* = \mu^*\left(2\left(\frac{1}{r^*}\frac{\partial v_\theta^*}{\partial \theta^*} + \frac{v_r^*}{r^*}\right) - \frac{2}{3}\nabla \cdot \vec{v}^*\right) \tag{5}$$

$$\tau_{zz}^* = \mu^*\left(2\frac{\partial v_z^*}{\partial z^*} - \frac{2}{3}\nabla \cdot \vec{v}^*\right) \tag{6}$$

$$\tau_{r\theta}^* = \tau_{\theta r}^* = \mu^*\left(r^*\frac{\partial}{\partial r^*}\left(\frac{v_\theta^*}{r^*}\right) + \frac{1}{r^*}\frac{\partial v_r^*}{\partial \theta^*}\right) \tag{7}$$

$$\tau_{\theta z}^* = \tau_{z\theta}^* = \mu^*\left(\frac{\partial v_\theta^*}{\partial z^*} + \frac{1}{r^*}\frac{\partial v_z^*}{\partial \theta^*}\right) \tag{8}$$

$$\tau_{rz}^* = \tau_{zr}^* = \mu^*\left(\frac{\partial v_z^*}{\partial r^*} + \frac{\partial v_r^*}{\partial z^*}\right) \tag{9}$$

In an embodiment of the present invention it is reasonable to assume that the fluid is incompressible, such that boundary condition described in equation (10) applies.

$$\nabla \cdot \vec{v}^* = 0 \tag{10}$$

In an embodiment of the present invention it also reasonable to assume axial symmetry, such that the boundary conditions described in equation (11) apply.

$$\frac{\partial}{\partial \theta} = 0$$
$$v_\theta^* = 0 \tag{11}$$

Equations (1) and (3) may be reduced taking the assumptions in equations (10) and (11) into account yielding equations (12) and (13) as a result, which also include the substitutions of equations (4)-(9). Equation (2) reduces to zero when the assumptions in equation (10) and (11) are taken into account.

$$\rho^*\left(\frac{\partial v_r^*}{\partial t^*} + v_r^* \frac{\partial v_r^*}{\partial r^*} + v_z^* \frac{\partial v_r^*}{\partial z^*}\right) = -\frac{\partial p^*}{\partial r^*} + \tag{12}$$
$$\mu^*\left[\frac{\partial}{\partial r^*}\left(\frac{1}{r^*}\frac{\partial(r^* v_r^*)}{\partial r^*}\right) + \frac{\partial^2 v_r^*}{\partial z^{*2}}\right] + 2\frac{\partial v_r^*}{\partial r^*}\frac{\partial \mu^*}{\partial r^*} + \left(\frac{\partial v_z^*}{\partial r^*} + \frac{\partial v_r^*}{\partial z^*}\right)\frac{\partial \mu^*}{\partial z^*}$$

$$\rho^*\left(\frac{\partial v_z^*}{\partial t^*} + v_r^* \frac{\partial v_z^*}{\partial r^*} + v_z^* \frac{\partial v_z^*}{\partial z^*}\right) = \tag{13}$$
$$-\frac{\partial p^*}{\partial z^*} + \mu^*\left[\frac{1}{r^*}\frac{\partial}{\partial r^*}\left(r^* \frac{\partial v_z^*}{\partial r^*}\right) + \frac{1}{r^{*2}}\frac{\partial^2 v_z^*}{\partial \theta^{*2}} + \frac{\partial^2 v_z^*}{\partial z^{*2}}\right] +$$
$$2\frac{\partial v_z^*}{\partial z^*}\frac{\partial \mu^*}{\partial r^*} + \left(\frac{\partial v_z^*}{\partial r^*} + \frac{\partial v_r^*}{\partial z^*}\right)\frac{\partial \mu^*}{\partial r^*}$$

It should be appreciated that along the interface between the droplet and the environment which may be a vacuum, normal stresses and tangential stresses are balanced as described in equations (14) and (15). The pressure p* in the droplet at the interface is balanced by the environmental pressure p*$_A$, the surface energy which depends on the mean curvature of the droplet surface and the stress orthogonal to and at the interface as described by equation (14). In an embodiment of the present invention which includes a simulation of a droplet evaporating in a vacuum the tangential stress along the interface is zero as described by equation (15).

$$p^* = p_A^* - \frac{\sigma}{r^*}\frac{\partial}{\partial r^*}\left(\frac{r^*\frac{\partial h^*}{\partial r^*}}{\sqrt{1 + \left(\frac{\partial h^*}{\partial r^*}\right)^2}}\right) + \tag{14}$$
$$2\mu^* \frac{\left(\frac{\partial h^*}{\partial r^*}\right)^2 \frac{\partial v_r^*}{\partial r^*} - \frac{\partial h^*}{\partial r^*}\left(\frac{\partial v_r^*}{\partial z^*} + \frac{\partial v_z^*}{\partial r^*}\right) + \frac{\partial v_z^*}{\partial z^*}}{1 + \left(\frac{\partial h^*}{\partial r^*}\right)^2}$$

$$\frac{\partial h^*}{\partial r^*}\left(\frac{\partial v_r^*}{\partial r^*} - \frac{\partial v_z^*}{\partial z^*}\right) + \frac{1}{2}\left(\left(\frac{\partial h^*}{\partial r^*}\right)^2 - 1\right)\left(\frac{\partial v_r^*}{\partial z^*} + \frac{\partial v_z^*}{\partial r^*}\right) = 0 \tag{15}$$

In an embodiment of the present invention it is reasonable to assume that that the ambient pressure p*$_A$ is a constant and in a vacuum is zero. In the above equations h* is a function that describes the droplet profile as a function of time and space, e.g., in one embodiment is the height of the droplet above a first plane.

As mentioned above, the droplet is a solution composed of an incompressible fluid (solvent), and a solute. As the solvent evaporates into the ambient environment over time, the solute concentration becomes higher, which in turn, causes the viscosity of the droplet to vary over time. The viscosity of the fluid may be represented by equation (16) in which $\eta_{sp}$ is the specific viscosity of the solution and μ*$_0$ is the initial fluid viscosity.

$$\mu^* = (1+\eta_{sp})\mu_0^* \tag{16}$$

The specific viscosity $\eta_{sp}$ may be represented as a function solute concentration and/or time. In an embodiment of the present invention Ozawa's model as described in equation (17) may be used to describe how the specific viscosity $\eta_{sp}$ changes with the concentration. The variables n and the gelation concentration $C_g$ are dependent upon the materials used in the droplet.

$$\eta_{sp} = \frac{1}{1-\left(\frac{C(r,t)}{C_g}\right)^n} - 1 \qquad (17)$$

Figure 2:
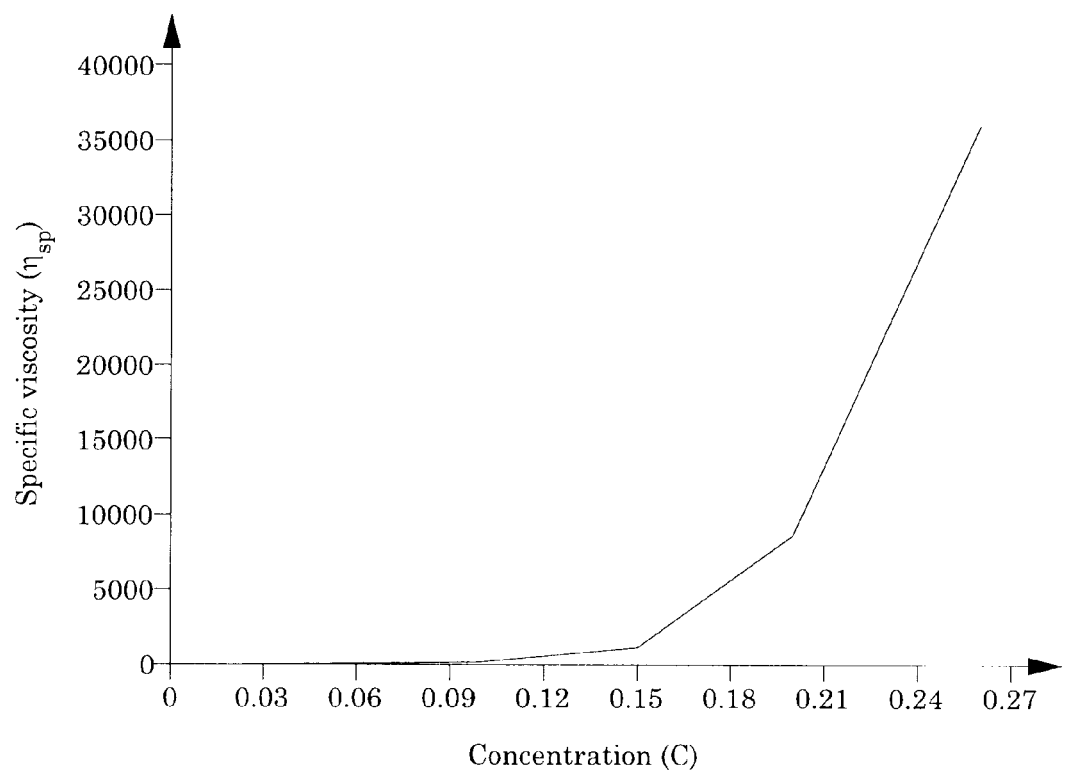
FIG. 2 is an illustration of experimental data that may be used in an embodiment of the present invention.

An embodiment of the present invention may instead use experimental data of the specific viscosity ($\eta_{sp}$) as a function of the concentration as illustrated in FIG. 2. An embodiment of the present invention may include other models of the specific viscosity.

In an embodiment of the present invention an appropriate time scale and a length scale are chosen. In an embodiment of the present invention these scales may be chosen relative to the height of the droplet and local velocity of the fluid. Other scales may be chosen without going beyond the scope and spirit of the present application. An individual skilled in the art will appreciate that these scales are chosen to ensure stability, and accuracy of the simulation. Equations (18) describe how the velocity v, the pressure p, and the time t are scaled relative to a length $h^*_0$, a length $r^*_0$, a viscosity $\mu^*_0$, and a density $\rho^*$. The Reynolds number Re, may also be written in terms of those scaling parameters.

$$U^*_c = \frac{\mu^*_0}{\rho^* h^*_0} \qquad (18)$$
$$v^*_\theta = U^*_c v_\theta$$
$$v^*_r = U^*_c v_r$$
$$v^*_z = U^*_c v_z$$
$$r^* = r^*_0 r$$
$$z^* = h^*_0 z$$
$$Re = \frac{\rho^* U^*_c h^*_0}{\mu^*_0}$$
$$p^*_c = \frac{\mu^*_0 U^*_c r^*_0}{h^{*2}_0}$$
$$p^* = p^*_c p_r$$
$$t^*_c = \frac{r^*_0}{U^*_c}$$
$$t^* = t^*_c t$$

In an embodiment of the present invention the ratio $$\varepsilon = \frac{h^*_0}{r^*_0}$$

may be assumed to be small, this is a reasonable assumption for a thin droplet. Equations (12) and (13) may be written in terms of dimensionless variables and the ratio $\varepsilon$ as shown in equations (19) and (20)

$$\varepsilon Re\left(\frac{\partial v_r}{\partial t} + v_r \frac{\partial v_r}{\partial r} + v_z \frac{\partial v_r}{\partial z}\right) = (1+\eta_{sp})\left(\varepsilon^2 \frac{\partial}{\partial r}\left(\frac{1}{r}\frac{\partial(rv_r)}{\partial r}\right) + \frac{\partial^2 v_r}{\partial z^2}\right) - \frac{\partial p}{\partial r} + \varepsilon^2 \frac{\partial v_r}{\partial r}\frac{\partial \eta_{sp}}{\partial r} + \left(\varepsilon^2 \frac{\partial v_z}{\partial r} + \frac{\partial v_r}{\partial z}\right)\frac{\partial \eta_{sp}}{\partial z} \qquad (19)$$

$$\varepsilon Re\left(\frac{\partial v_z}{\partial t} + v_r \frac{\partial v_z}{\partial r} + v_z \frac{\partial v_z}{\partial z}\right) = (1+\eta_{sp})\left(\varepsilon^2 \frac{\partial}{\partial r}\left(\frac{1}{r}\frac{\partial(rv_z)}{\partial r}\right) + \frac{\partial^2 v_z}{\partial z^2}\right) - \frac{1}{\varepsilon^2}\frac{\partial p}{\partial z} + \frac{\partial v_z}{\partial z}\frac{\partial \eta_{sp}}{\partial z} + \left(\varepsilon^2 \frac{\partial v_z}{\partial r} + \frac{\partial v_r}{\partial z}\right)\frac{\partial \eta_{sp}}{\partial r} \qquad (20)$$

In an embodiment of the present invention it is assumed that the ratio $\varepsilon$ is much less than one, in which case the relations set forth in equations (21) are also true.

$$\varepsilon^2 << 1 \qquad (21)$$
$$\varepsilon Re << 1$$
$$\frac{\partial \eta_{sp}}{\partial z} = 0$$
$$\eta_{sp}\varepsilon^2 << 1$$

Equations (21) may be used to sort the terms in equations (19) and (20) in order of the ratio $\varepsilon$. Given the assumptions stated in equation (21), which are valid for a thin film, equation (19) may be modified by keeping only the leading order terms as shown in a simplified equation (22). Similarly, the leading order term of equation (20) may be kept and other terms dropped such equation (23) is a good approximation of equation (20).

$$\frac{\partial p}{\partial r} + (1+\eta_{sp})\frac{\partial^2 v_r}{\partial z^2} = 0 \qquad (22)$$

$$-\frac{\partial p}{\partial z} = 0 \qquad (23)$$

The incompressible restraint can be written as equation (24).

$$\frac{1}{r}\frac{\partial}{\partial r}(rv_r) + \frac{\partial v_z}{\partial z} = 0 \qquad (24)$$

In an embodiment of the present invention the ambient environment is a vacuum in which case $p^*_A$ is zero and $\varepsilon^2 \eta_{sp} << 1$. Converting equation (14) to dimensionless variables and keeping only leading order terms gives us an approximation of the normal stress condition as described by equation (25).

$$p = -\frac{1}{Ca}\frac{1}{r}\frac{\partial}{\partial r}\left(r\frac{\partial h}{\partial r}\right) \qquad (25)$$

The Capillary number (Ca) may be defined as $$Ca = \frac{\mu^{*2}}{\varepsilon^3 \rho^* \sigma^* h^*_0}.$$

In addition, the leading order terms of the tangential stress condition described by equation (15), using dimensionless variables is described by equation (26).

$$\frac{\partial v_r}{\partial r} = 0 \tag{26}$$

Solving equations (22), (23), and (24) with the boundary conditions described by equations (25) and (26), the leading order dimensionless lubrication equations can be derived for the droplet height profile h and solute concentration C, The kinematic boundary condition along the interface is described in equation (27) in both dimensioned and dimensionless form. The variable J* is the dimensioned evaporation rate which may be a function of both space and time. In an alternative embodiment of the present invention the evaporation rate is constant. The evaporation rate may also be defined in terms of another system variable such as the height h or the concentration C. The variable E=½ is a dimensionless scaling parameter.

$$\frac{\partial h^*}{\partial t^*} = -\frac{1}{r^*}\frac{\partial}{\partial r^*}(r^* h^* \langle v_r^* \rangle) - J^*(r^*, t^*) \tag{27}$$

$$\frac{\partial h}{\partial t} = -\frac{1}{r}\frac{\partial}{\partial r}(rh\langle v_r \rangle) - EJ(r, t)$$

Equation (28) is the definition of $\langle v^*_r \rangle$ is the radial velocity averaged across the vertical axis. Equation (22) may be integrated twice over the variable z to give a definition of $v_r$ in terms of p and z. Equation (22) is independent of z as described by equation (23). Equation (23) is a useful approximation that allows us to significantly simplify the problem. Equation (25) may be substituted into equation (22). These approximations allow the radial velocity to be written in terms of the height of the droplet as shown in equation (29). The capillary number Ca, as used in equation (29) is a scaling parameter of the simulation and is representative of the relative effect of viscous forces versus surface tension at the interface. Equation (29) may be substituted into equation (27) providing a description of how the height of the droplet varies over time as shown in equation (30).

$$\langle v_r^* \rangle = \frac{1}{h^*}\int_0^{h^*} v_r^* dz^* \tag{28}$$

$$\langle v_r \rangle = \frac{1}{h}\int_0^{h} v_r dz = \frac{-1}{3Ca}\frac{1}{1+\eta_{sp}}h^2\frac{\partial}{\partial r}\left(\frac{\partial^2 h}{\partial r^2} + \frac{1}{r}\frac{\partial h}{\partial r}\right) \tag{29}$$

$$\frac{\partial h}{\partial t} = \frac{1}{r}\frac{\partial}{\partial r}\left(\frac{1}{3Ca}\frac{1}{1+\eta_{sp}}h^3 r\frac{\partial}{\partial r}\left(\frac{\partial^2 h}{\partial r^2} + \frac{1}{r}\frac{\partial h}{\partial r}\right)\right) - EJ(r, t) \tag{30}$$

Equation (31) describes how the solute concentration satisfies the convection-diffusion equation. Equation (31) also describes how an intermediate variable h*C* changes over time. Equation (31) includes two terms, a first term that is dependent on the velocity of the solution and a second term that describes the diffusion of the solute in the solvent. The second term of equation (31) includes a diffusion coefficient D* of the solute in the solvent which is dependent upon the properties of the solvent and the solute.

$$\frac{\partial(h^*C^*)}{\partial t^*} = -\frac{1}{r^*}\frac{\partial}{\partial r^*}(r^* h^* \langle v_r^* \rangle C^*) + D^*\frac{1}{r^*}\frac{\partial}{\partial r^*}\left(r^* h^* \frac{\partial C^*}{\partial r^*}\right) \tag{31}$$

The dimensionless form of equation (31) is equation (32).

$$\frac{\partial(hC)}{\partial t} = -\frac{1}{r}\frac{\partial}{\partial r}(rh\langle v_r \rangle C) + \frac{1}{Sc}\frac{1}{r}\frac{\partial}{\partial r}\left(rh\frac{\partial C}{\partial r}\right) \tag{32}$$

The variable Sc is a dimensionless Schmidt like number as defined in equation (33). In the context of the present application both equations (30) and (32) may be considered lubrication equations.

$$\frac{1}{Sc} = \frac{D^*}{U_0^* r_0^*} \tag{33}$$

In an embodiment of the present invention a solution to equations (30) and (32) is sought. In an embodiment of the present invention the computational domain may be scaled such that the dimensionless domain is between 0 and 1. In an embodiment of the present invention the boundary conditions are described by equations (34)-(35).

$$\left.\frac{\partial h}{\partial r}\right|_{r=0} = 0 \tag{34}$$

$$\left.\frac{\partial^3 h}{\partial r^3}\right|_{r=0} = 0$$

$$h|_{r=1} = 0 \tag{35}$$

$$h\langle v_r \rangle|_{r=1} = 0$$

Figure 3:
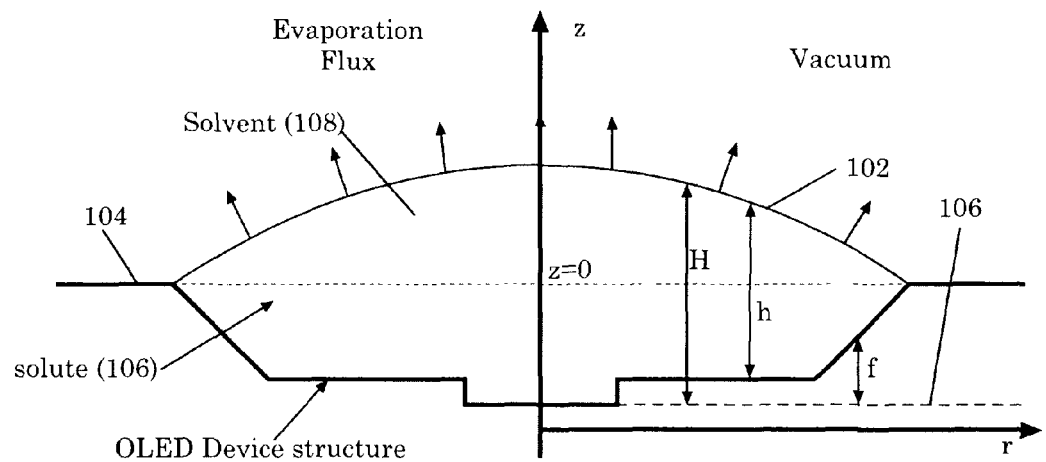
FIG. 3 is a simplified schematic diagram of a droplet disposed on a non-flat substrate in accordance with one embodiment of the invention.

The boundary condition on the third order partial derivative of the height of the droplet at the center of the droplet described in equations (34) is related to the total radial velocity of the fluid in the droplet. In an embodiment of the present invention it is reasonable to assume this boundary condition. An embodiment of the present invention may be used to describe the behavior of a droplet 102 sitting on a non-flat substrate 104 such as an OLED bank structure shown in FIG. 3. The variable H is representative of the height of the droplet 102 relative to a plane 106. The variable h is representative of the height of the droplet 102 relative to the substrate 104. The variable f is representative of the height of the non-flat substrate 104 relative to the plane 106. The droplet 102 is a solution of solute particles 106 that are dissolved in a solvent 108. In an embodiment of the present invention, the droplet 101 is a single phase fluid. It should be appreciated by an individual skilled in the art that the substrate 108 may be any semiconductor device capable of utilizing the inkjet technique described herein. The r and z coordinate axes as illustrated in FIG. 3 are relative to a central region of droplet 102, although other origins may be used with out going beyond the scope and spirit of the applicants' invention.

Equations (22)-(24), (26), and (27) still hold in the lubrication model for a non-flat substrate. Equation (36) is equation (28) rewritten to take the non-flat substrate into account.

$$\langle v_r^* \rangle = \frac{1}{H^* - f^*}\int_{f^*}^{H^*} v_r^* dz^* \tag{36}$$

In an embodiment of the present invention the radial velocity $v^*_r$ may be approximated using the leading order terms as shown in equation (37).

$$v_r^* = \frac{1}{\mu^*} \frac{\partial p^*}{\partial r^*} \left( \frac{1}{2}(z^{*2} - f^{*2}) - H^*(z^* - f^*) \right) \quad (37)$$

When the substrate is taken into account equation (25) may be written in terms of H as shown in equation (38).

$$p = -\frac{1}{Ca} \frac{1}{r} \frac{\partial}{\partial r}\left( r \frac{\partial H}{\partial r} \right) \quad (38)$$

Equations (30) and (32) may also be written taking the substrate into account as shown in equations (39) and (40). Equations (39) and (40) are formed by replacing some instances of the height of the droplet found in equations (30) and (31) with height of the droplet above the substrate (H-f) and in some instances with the height of the droplet above the plane (H). In the context of the present application, both equations (39) and (40) may be considered lubrication equations.

$$\frac{\partial H}{\partial t} = -\frac{1}{3Ca} \frac{1}{r} \frac{\partial}{\partial r} \left[ \begin{array}{c} \frac{r}{1+\eta_{sp}}(H-f)^3 \\ \frac{\partial}{\partial r}\left(\frac{\partial^2 H}{\partial r^2} + \frac{1}{r}\frac{\partial H}{\partial r}\right) \end{array} \right] - EJ(r,t) \quad (39)$$

$$\frac{\partial[(H-f)C]}{\partial t} = -\frac{1}{3Ca} \frac{1}{r} \frac{\partial}{\partial r} \left\{ \begin{array}{c} \frac{r}{1+\eta_{sp}}(H-f)^3 \\ \frac{\partial}{\partial r}\left[\frac{1}{r}\frac{\partial}{\partial r}\left(r\frac{\partial H}{\partial r}\right)\right] C \end{array} \right\} +$$

$$\frac{1}{Sc} \frac{1}{r} \frac{\partial}{\partial r} \left[ r(H-f) \frac{\partial C}{\partial r} \right] \quad (40)$$

The boundary conditions described in equations (34) and (35) may also be modified to take the non-flat substrate into account as shown in equations (41) and (42).

$$\left.\frac{\partial H}{\partial r}\right|_{r=0} = \left.\frac{\partial f}{\partial r}\right|_{r=0}, \left.\frac{\partial^3 H}{\partial r^3}\right|_{r=0} = \left.\frac{\partial^3 f}{\partial r^3}\right|_{r=0}, \left.\frac{\partial C}{\partial r}\right|_{r=0} = 0 \quad (41)$$

$$h|_{r=1} = f|_{r=1}, (H-f)\langle v_r \rangle|_{r=1} = 0 \quad (42)$$

Numerical Algorithm

In an embodiment of the present invention these equations are solved using a numerical method. Solving these equations using numerical methods can be difficult because the equations include fourth order differential terms and the equations are stiff. Finding a stable and accurate method for solving stiff fourth order differential equations can be very difficult and is very dependent upon the form of the equations.

Described below is a general numerical procedure to solve a droplet evaporation equation (39) and a solute flow, diffusion lubrication equation (40) with a regular finite difference grid. An individual skilled in the art will appreciate that modifications of this method are still within the spirit and scope of the invention as described in the claims.

Figure 4:
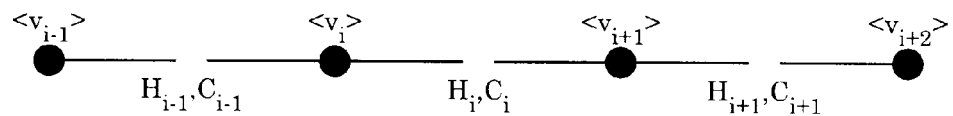
FIG. 4 illustrates a numerical finite difference grid set up along a computational domain [0, 1] utilized for the general numerical procedure in accordance with an embodiment of the invention.

FIG. 4 illustrates a numerical finite difference grid set up along the computational domain [0, 1] utilized for the general numerical procedure in accordance with an embodiment of the invention. An individual skilled in the art will appreciate how to extend the present invention into higher dimensions.

As shown in FIG. 4, the height H and the concentration C are defined at the cell centers, and average velocities <v> are defined at the cell edges. The applicants have found that evaluating these variables at these spatial positions improves the stability of the simulation.

Temporal Discretization

The matrices M and N as defined in equations (43) and (44) are used to simplify the presentation of the numerical method, and are representative of parts of equations (39) and (40). The matrices M and N are m×m matrices, wherein m is the number nodes in the simulation. The matrices $M_i$, $N_i$, H, f, J, and C are m×1 matrices that correspond to the identified variables. The matrices $M_i$ and $N_i$, may be thought of as differential operators. Each partial derivative operator may be written as vector with an index j. As described in equation (45) each partial derivative may be a first order Taylor expansion. An individual skilled in the art will appreciate that other treatments of the derivative may be used with out going beyond the spirit and scope of the present invention.

The matrix $M^n$ may be defined in terms of sub-matrices $M_i^n$ as described in equation (43a).

$$M^n = \begin{bmatrix} M_1^n \\ \vdots \\ M_i^n \\ \vdots \\ M_m^n \end{bmatrix} \quad (43a)$$

Each sub-matrix $M_i^n$ is a differential operator as described in equation (43b).

$$M_i^n H_i^{n+1} = -\frac{1}{3Ca} \frac{1}{r_i} \left[ \frac{\partial}{\partial r_i} \left( \frac{\frac{r}{1+\eta_{sp}}(H^n - f)^3}{\frac{\partial}{\partial r}\left(\frac{\partial^2}{\partial r^2} + \frac{1}{r}\frac{\partial}{\partial r}\right)} \right) \right] H_i^{n+1} \quad (43b)$$

Each differential operator may be approximated with a finite difference operator such as the one described in equation (43c).

$$\frac{\partial}{\partial r_i}(\Box) = \frac{\Box_{i+\frac{1}{2}} - \Box_{i-\frac{1}{2}}}{\Delta r_i} \quad (43c)$$

The differential operator and the finite difference operators from equation (43c) may be applied to a second differential operator such as the one described in equation (43d).

$$\Box = \frac{r}{1+\eta_{sp}}(H^n - f)^3 \frac{\partial}{\partial r}\left(\frac{\partial^2}{\partial r^2} + \frac{1}{r}\frac{\partial}{\partial r}\right) \quad (43d)$$

When the finite difference operator is applied to the second differential operator in equation (43d), a part of it may take the form of equation (43e). An individual skilled in the art would appreciate how the backward half step may be calculated.

$$\Box_{i+\frac{1}{2}} = \frac{r_{i+\frac{1}{2}}}{1+\eta_{sp_{i+\frac{1}{2}}}}(H^n_{i+\frac{1}{2}} - f_{i+\frac{1}{2}})^3 \frac{\partial}{\partial r_{i+\frac{1}{2}}}\left(\frac{\partial^2}{\partial r^2} + \frac{1}{r}\frac{\partial}{\partial r}\right) \quad (43e)$$

Equation (43e) includes an additional differential operator may also be approximated by an additional finite difference operator as described by equation (43f).

$$\frac{\partial}{\partial r_{i+\frac{1}{2}}}(\bigcirc) = \frac{(\bigcirc)_{i+1} - (\bigcirc)_i}{\Delta r_i} \quad (43f)$$

The operator used in equation (43f) may be the second order differential operator described in equation (43g).

$$\bigcirc = \frac{\partial^2}{\partial r^2} + \frac{1}{r}\frac{\partial}{\partial r} \quad (43g)$$

Equation (43h) describes the result of applied the finite difference form of the operator from equation (43g).

$$\bigcirc_i H_i = \frac{H_{i+1} - 2H_i + H_{i-1}}{(\Delta r_i)^2} + \frac{1}{r_i}\frac{H_{i+1} - H_{i-1}}{2\Delta r_i} \quad (43h)$$

The details about the differential operators described in equation (44) are explained in the following paragraphs.

$$N^n = \begin{bmatrix} N_1^n \\ \vdots \\ N_i^n \\ \vdots \\ N_m^n \end{bmatrix} \quad (44)$$

$$N_i^{n+1} C_i^{n+1} = \begin{bmatrix} -\frac{1}{r_i}\frac{\partial}{\partial r_i}(r(H^{n+1}-f)\langle v_r\rangle^{n+1}) + \\ \frac{1}{Sc}\frac{\partial}{\partial r_i}\left(r(H^{n+1}-f)\frac{\partial}{\partial r}\right) \end{bmatrix} C_i^{n+1}$$

The average radial velocity may be found using equations (45), (37) and (38).

$$\langle v_r \rangle_i = \frac{1}{H_i - f_i}\int_{f}^{H} v_{r_i} dz \quad (45)$$

$$= \frac{1}{3Ca}\frac{1}{1+\eta_{sp}}(H_i - f_i)^2 \frac{\partial}{\partial r_i}\left(\frac{\partial^2 H_i}{\partial r_i^2} + \frac{1}{r_i}\frac{\partial H_i}{\partial r_i}\right)$$

Equation (39) may be written in terms of equation (43) as in equation (46) and solved for $H^{n+1}$ such that that a new height may be found.

$$[I - \Delta t M^n] H^{n+1} = H^n - \Delta t E J^n \quad (46)$$

The evaporation rate may be modeled using the Ozawa model $$J^n(r, t) = J_0 \left[1 - \frac{C^n(r, t)}{C_g}\right]$$

in which $C_g$ is the gelation concentration for the solute. The variable $J_0$ is the initial evaporation rate. $J_0$ may be constant or may be a spatial function.

The result of equation (46) may be used along with equation (44) to calculate a new concentration profile $C^{n+1}$ as described by equation (47).

$$[(H^{n+1}-f)I - \Delta t N^{n+1}]C^{n+1} = [(H^{n+1}-f)I]C^n \quad (47)$$

Spatial Discretization

To treat the diffusion term $$\frac{1}{Sc}\frac{1}{r}\frac{\partial}{\partial r}\left(r(H^{n+1}-f)\frac{\partial C^{n+1}}{\partial r}\right)$$

in equation (44) properly, the concentration C is defined at the cell centers at the same location as H, and f. Equations (48)-(51) describe how second order expansions of the spatial derivatives in the diffusion term may be evaluated.

$$\left[\frac{1}{Sc}\frac{1}{r}\frac{\partial}{\partial r}\left(r(H^{n+1}-f)\frac{\partial C^{n+1}}{\partial r}\right)\right]_i = \quad (48)$$

$$\frac{1}{Sc}\frac{1}{r_i \Delta r}\left(\left[r(H^{n+1}-f)\frac{\partial C^{n+1}}{\partial r}\right]_{i+\frac{1}{2}} - \left[r(H^{n+1}-f)\frac{\partial C^{n+1}}{\partial r}\right]_{i-\frac{1}{2}}\right)$$

$$\left[r(H^{n+1}-f)\frac{\partial C^{n+1}}{\partial r}\right]_{i+\frac{1}{2}} = r_{i+\frac{1}{2}}\left(\frac{H_i^{n+1} + H_{i+1}^{n+1}}{2} - f_{i+\frac{1}{2}}\right)\frac{C_{i+1}^{n+1} - C_i^{n+1}}{\Delta r} \quad (49)$$

$$\left[r(H^{n+1}-f)\frac{\partial C^{n+1}}{\partial r}\right]_{i-\frac{1}{2}} = r_{i-\frac{1}{2}}\left(\frac{H_i^{n+1} + H_{i-1}^{n+1}}{2} - f_{i-\frac{1}{2}}\right)\frac{C_i^{n+1} - C_{i-1}^{n+1}}{\Delta r}$$

$$r_i = \left(i - \frac{1}{2}\right)\Delta r \quad (50)$$

$$r_{i+\frac{1}{2}} = i \Delta r \quad (51)$$

The convection term as used in equation (43) may be discretized using second order approximations of the spatial derivatives as described in equations (52)-(57). The variable $\langle v_r \rangle$ is evaluated at the cell edges, while the concentration and the height are evaluated at the cell centers, as shown in FIG. 4. For terms that involve the product of a cell centered value and a cell edge value, the cell edge values are averaged to calculate the cell center values.

$$\left[-\frac{1}{r}\frac{\partial}{\partial r}(r(H^{n+1}-f)\langle v_r\rangle^{n+1}C^{n+1})\right]_i = \quad (52)$$

$$\left[-\frac{1}{r}(H^{n+1}-f)\langle v_r\rangle^{n+1}C^{n+1} - \frac{\partial}{\partial r}((H^{n+1}-f)\langle v_r\rangle^{n+1}C^{n+1})\right]_i = -$$

$$(H_i^{n+1} - f_i)\frac{\langle v_r\rangle_i^{n+1} + \langle v_r\rangle_{i+1}^{n+1}}{2}C_i^{n+1} -$$

$$\frac{[(H^{n+1}-f)\langle v_r\rangle^{n+1}C^{n+1}]_{i+1} - [(H^{n+1}-f)\langle v_r\rangle^{n+1}C^{n+1}]_{i-1}}{2\Delta r}$$

-continued $$[(H^{n+1} - f)\langle v_r \rangle^{n+1} C^{n+1}]_{i+1} = (H_{i+1}^{n+1} - f_{i+1}) \frac{\langle v_r \rangle_{i+1}^{n+1} + \langle v_r \rangle_{i+2}^{n+1}}{2} C_{i+1}^{n+1} \quad (53)$$

$$\langle v_r \rangle_{i+1}^{n+1} = \frac{1}{3Ca} \frac{1}{1 + [\eta_{sp}]_{i+1}} \left( \frac{H_i^{n+1} + H_{i+1}^{n+1}}{2} - f_{i+\frac{1}{2}} \right)^2 \times \quad (54)$$

$$\frac{\left( \frac{\partial^2 H}{\partial r^2} + \frac{1}{r} \frac{\partial H}{\partial r} \right)_{i+1}^{n+1} - \left( \frac{\partial^2 H}{\partial r^2} + \frac{1}{r} \frac{\partial H}{\partial r} \right)_i^{n+1}}{\Delta r}$$

$$\left[ \frac{\partial^2 H}{\partial r^2} + \frac{1}{r} \frac{\partial H}{\partial r} \right]_{i+\frac{3}{2}}^{n+1} = \frac{H_{i+2}^{n+1} - 2H_{i+1}^{n+1} + H_i^{n+1}}{\Delta r^2} + \frac{H_{i+2}^{n+1} - H_i^{n+1}}{2r_{i+\frac{3}{2}} \Delta r} \quad (55)$$

$$r_{i+1} = \left( i + \frac{1}{2} \right) \Delta r \quad (56)$$

$$r_{i+\frac{3}{2}} = (i+1)\Delta r \quad (57)$$

Figure 5A:
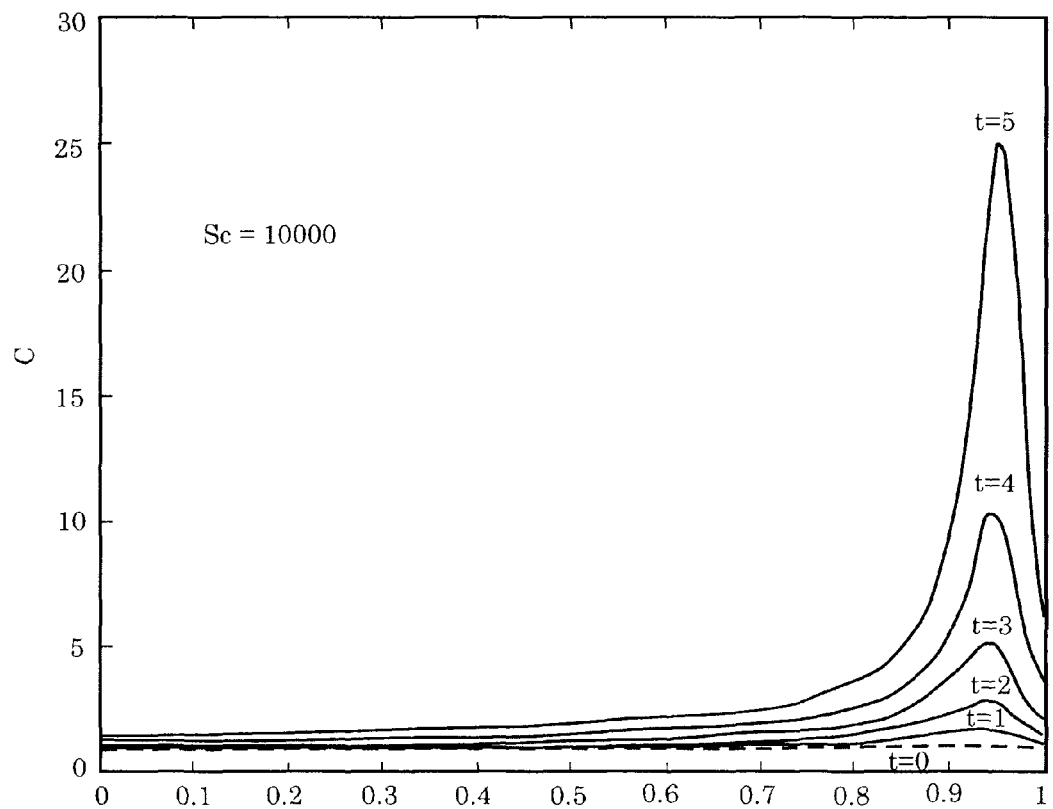
FIGS. 5A-C are illustrations showing the concentration of solute over time as a result produced by an embodiment of the invention.
Figure 5B:
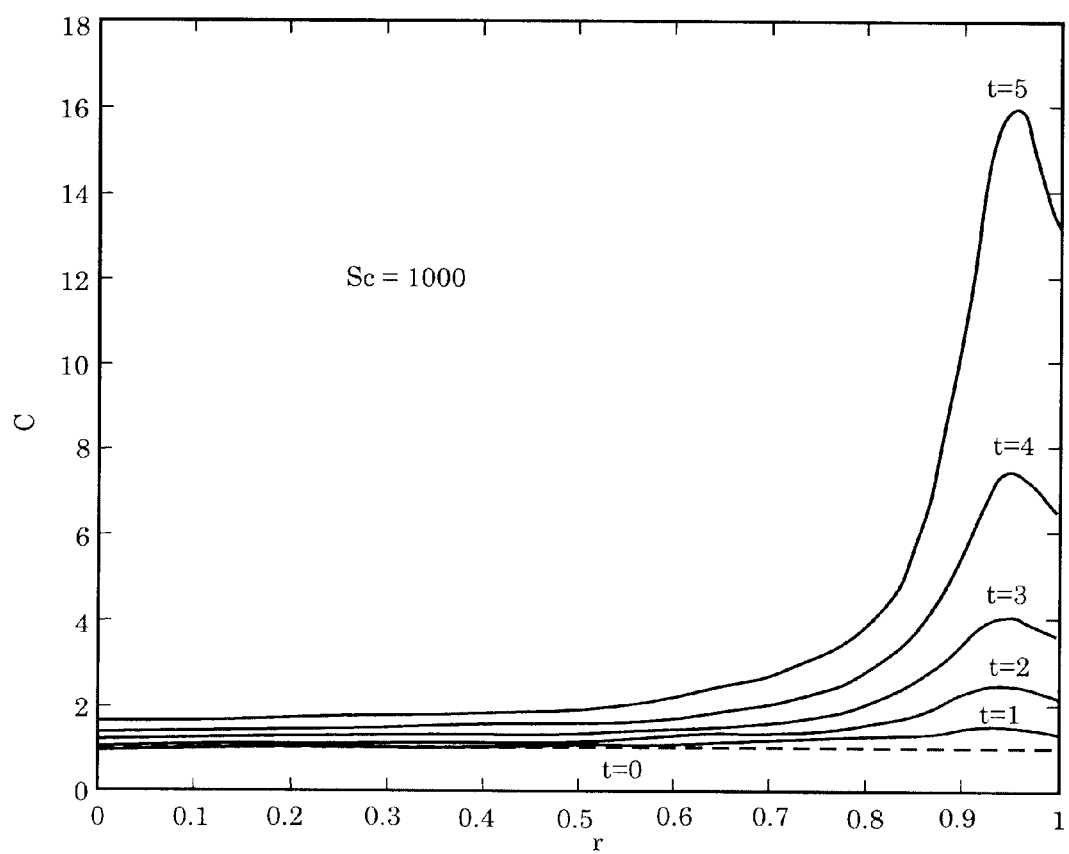
Figure 5C:
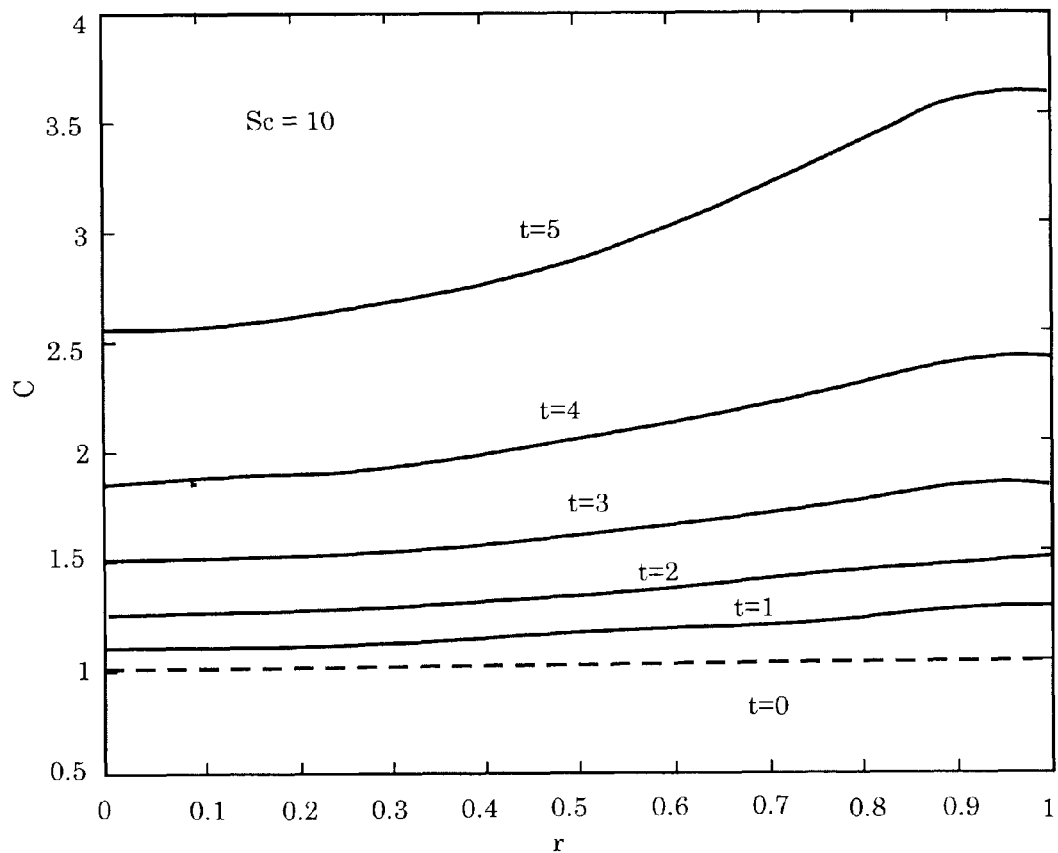
Figure 6A:
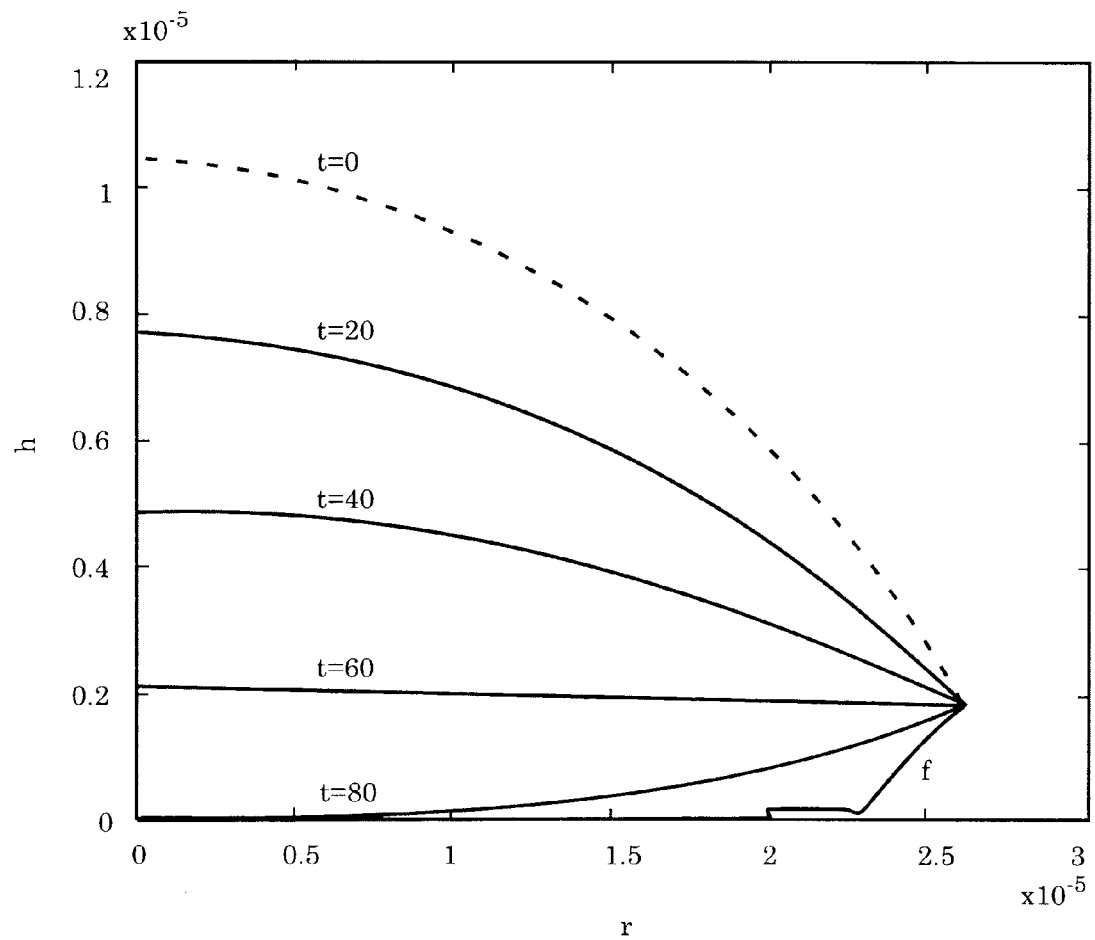
FIGS. 6A-B are illustrations of the evolution of the droplet's height over time as a result produced by an embodiment of the invention.

FIGS. 5A-C and 6A-B are normalized simulation results of an embodiment of the present invention that illustrate the evolution over time of a droplet profile and solute concentration with various Schmidt (Sc) numbers. As shown in FIG. 6A, at t=0 the droplet initially assumes a spherical shape over the non-flat substrate f.

As shown in FIGS. 5A-5C, initially at t=0 the solute concentration is uniform over the computational domain. As the droplet evaporates a higher concentration of solute gradually accumulates near the contact region. This is often referred to as the coffee ring phenomenon and has been observed experimentally under various circumstances. FIGS. 5A-5C illustrate the effects of decreasing the Schmidt number which is inversely correlated with the effects of diffusion as shown by equation (33). The final concentration profile shown in FIG. 5A is less uniform than the final concentration profile shown in FIG. 5B and FIG. 5C, in which the diffusion is greater.

Figure 6B:
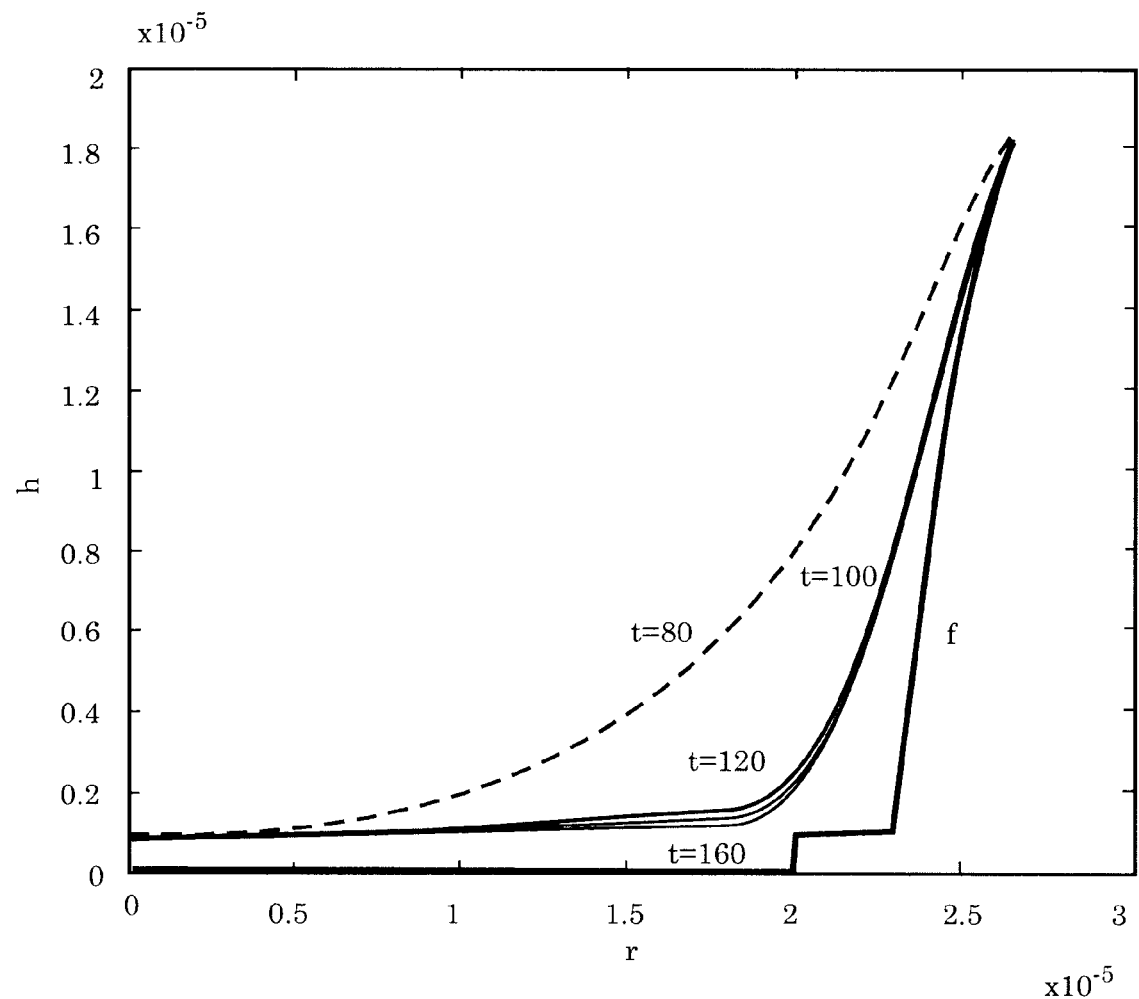
Figure 6C:
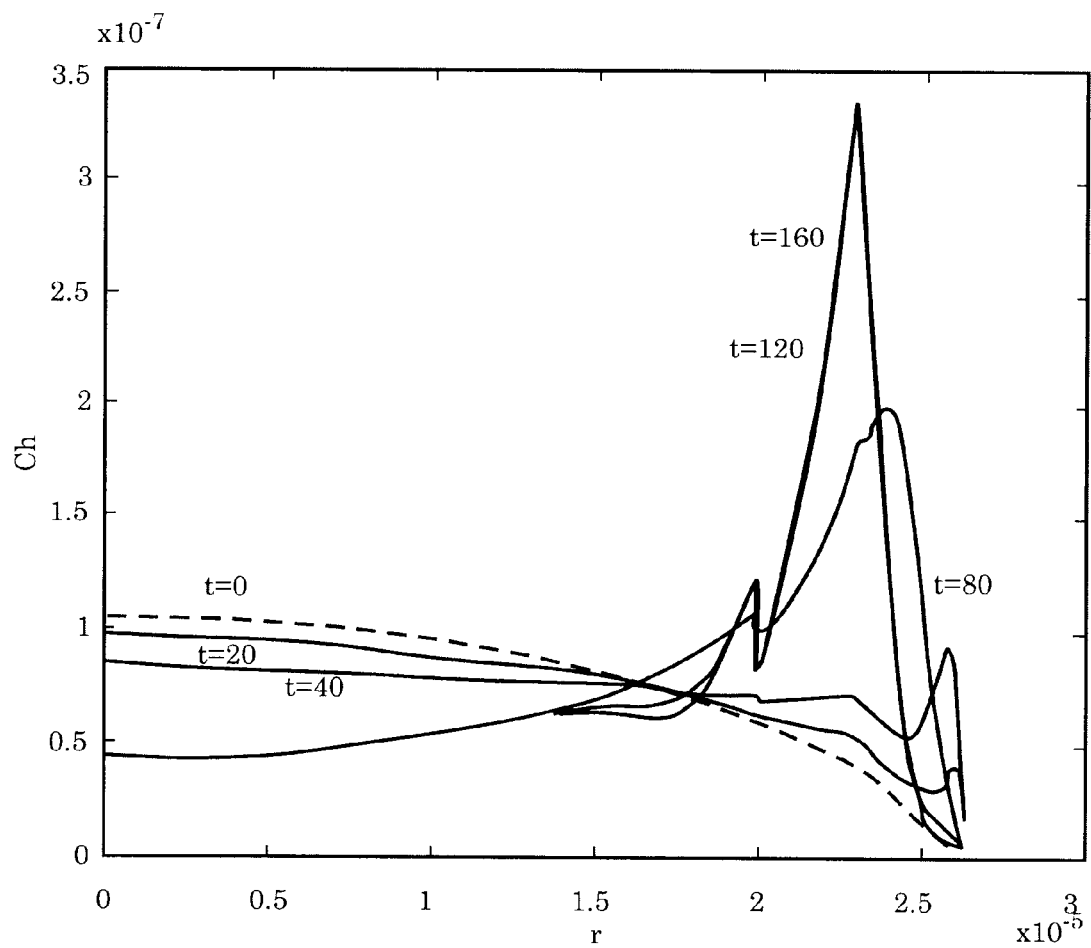
FIG. 6C is an illustration of an intermediate variable over time as a result produced by an embodiment of the invention.

As shown in FIGS. 6A-B, the droplet height becomes lower over time. As the droplet approaches its final shape, the profile has a slightly larger thickness near the contact region than the center of the droplet. FIG. 6C is an illustration of the evolution over time of the intermediate variable Ch on a non-flat substrate. The final uniformity and statistics about the intermediate variable Ch are good indicators of the performance of a filter created using the solution.

System

Figure 7:
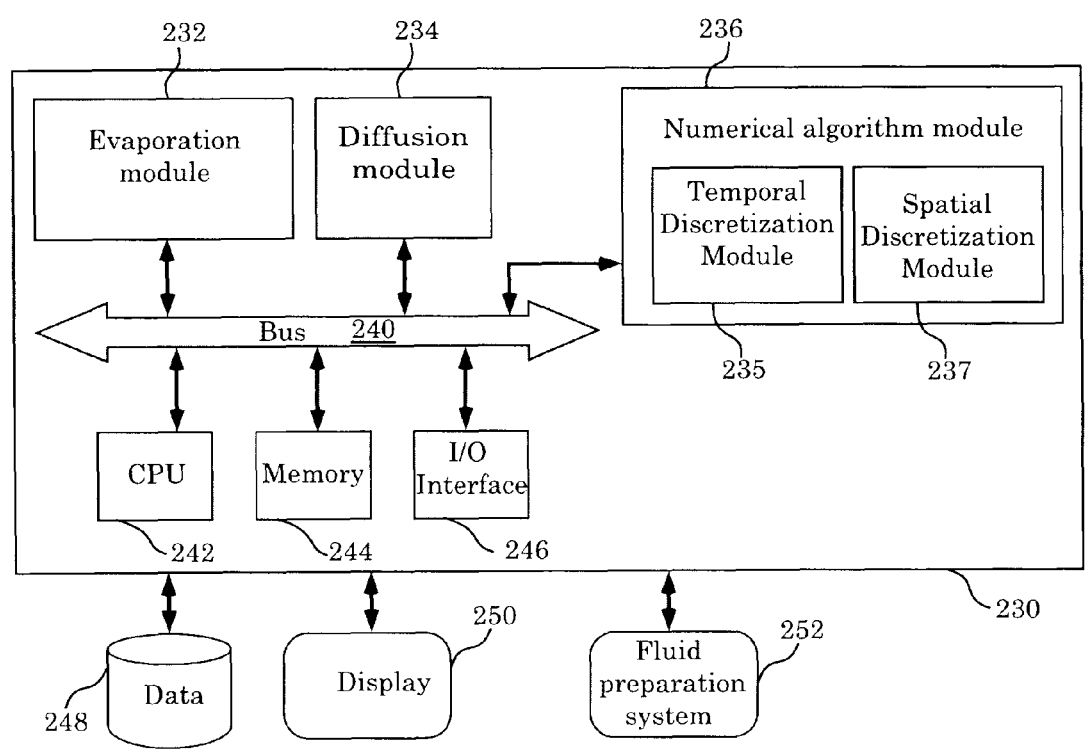
FIG. 7 is a simplified schematic diagram illustrating a system utilized to implement one or more aspects of the present invention.

Having described the details of the embodiments of the present invention, an exemplary system 230, which may be used to implement one or more aspects of the present invention, will now be described with reference to FIG. 7. As illustrated in FIG. 7, the system includes a processor 242 that provides computing resources and controls a computer. The processor (or CPU) 242 may be implemented with a microprocessor or the like, and may also include a graphics processor and/or a floating point coprocessor for mathematical computations. The system 230 also includes memory 244 which may be in the form of random-access memory (RAM) and read-only memory (ROM). The system 230 may also include an I/O interface 246 to enable data input/output operations as well as interfacing with a fluid preparation system 252. The I/O interface 246 may also provide an interface to one or more sensors to input data such as pressure, temperature, viscosity, etc. The fluid preparation system 252 may receive simulation data from the system 230 to enable the fluid preparation system 252 to adjust fluid properties of the fluid that is to be used in the inkjet printing process.

The system 230 further includes an evaporation module 232 that describes how a height profile of the droplet on a non-flat substrate changes over time in accordance with equation (39). A diffusion module 234 describes how the concentration profile of the solute in the droplet changes over time in accordance with equation (40). A numerical algorithm module 236 is used to solve the governing equations in accordance with the evaporation module 232 and the diffusion module 234 taking the boundary conditions described by equations (41) and (42) in to account. The numerical algorithm module 236 includes a temporal discretization module 235 and a spatial discretization module 237. Modules 235 and 237 perform the computational functionality described with reference to equations (43)-(47) and (48)-(57). In an embodiment of the present invention modules 232-237 may be implemented as interpreted and/or compiled computer code which may be stored in memory 244 and executed by a processor 242. The computational functionality performed by modules 232-237 may overlap occurring sequentially or in parallel. In an embodiment of the present invention, all modules that are a part of the system 230 are coupled together through an internal bus 240. One or more of the modules may also be coupled together through an external bus.

A number of controllers and peripheral devices may also be provided. In an embodiment of the present invention a display 250 may be used to present a simulation of the behavior of a droplet as it evaporates over time. The display 250 may show droplet properties selected from the group consisting of: physical properties; mechanical properties; fluid properties; statistical properties; final pattern of the droplet and other properties that are representative of the droplet its method of evaporation and its final state. The display 250 may use graphical or numerical methods of displaying the droplet properties. The display 250 may show simulation results which are an approximation of the effect of changes in environmental and other simulation properties on droplet properties. A storage module 248 may be used to store data about the simulation, the results of the simulation, complied code of the simulation, and/or interpreted code of the simulation.

A computer readable media such as magnetic tape or disk, or an optical medium can be used to store or record programs of instructions for operating systems, utilities and applications which may include embodiments of programs that implement various aspects of the present invention.

In the illustrated system, all major system components may connect to the bus 240, which may represent more than one physical bus. However, various system components may or may not be in physical proximity to one another. For example, input data and/or output data may be remotely transmitted from one physical location to another. In addition, programs that implement various aspects of this invention may be accessed from a remote location (e.g., a server) over a network. Such data and/or programs may be conveyed through any of a variety of machine-readable medium including magnetic tape, disk, optical disc, or a transmitter receiver pair.

The fluid preparation system 252 and the system 230 may be used as part of a manufacturing process. The manufacturing process may include adjusting the fluid based on the results of the simulation and adjusting the simulation based on changes in the manufacturing process. The manufacturing process may also be adjusted by changing the shape or the non-flat substrate. The simulation system may take into account variations in the quality of the product produced by the manufacturing process. The simulation system may also be used to identify sources of variations in the manufacturing process. An individual skilled in the art will appreciate how the system 230 may be incorporated into the manufacturing process using standard methods.

Flowchart

Figure 8:
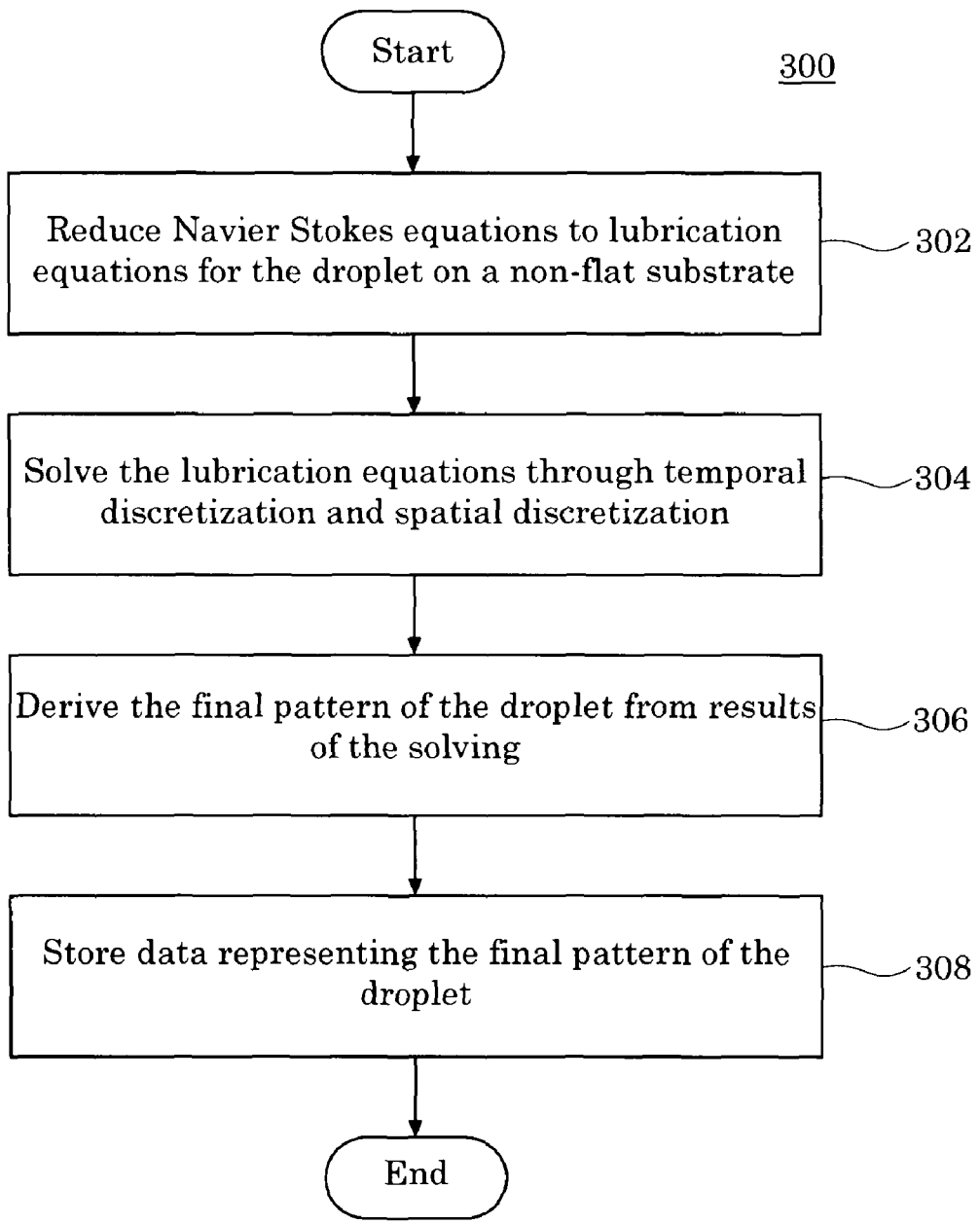
FIG. 8 is a flowchart diagram illustrating method operations for simulating the final pattern for a droplet in accordance with one embodiment of the invention.

FIG. 8 is a flowchart diagram illustrating a method 300 for simulating the final pattern for a droplet in accordance with one embodiment of the invention. The method initiates with operation 302 where the Navier Stokes equations are reduced to lubrication equations for the droplet on a non-flat substrate. Equations 1-44 provide the details for the reduction of the Navier Stokes equations to the lubrication equations, as well as the assumptions and boundary conditions. The lubrication equations are high order non-linear equations. In one embodiment of the present invention it may be assumed that the droplet evaporating is axi-symmetric. An individual skilled in the art would appreciate how to adapt the disclosed method to a droplet that lacked axial symmetry.

The method 300 then proceeds to operation 304 where the high order non-linear equations are solved through temporal discretization and spatial discretization. Equations 45-57 provide specific details on how the discretization may be performed in an embodiment of the present invention. Other embodiments of the present invention may include other methods of spatial and temporal discretization without going beyond the scope and spirit of the present invention. In one embodiment of the present invention, the spatial discretization is achieved through a central difference expression.

The method 300 then moves on to operation 306 where the final pattern of the droplet is generated from the above described calculations. In an operation 308 data about the final pattern of the droplet is stored and may also be displayed to a user. Thus, a user is able to simulate the pattern and achieve with a high degree of confidence a desired pattern by manipulating parameters for the droplet and simulating the patterns for each combination of parameters.

The present invention may be conveniently implemented with software. However, alternative implementations are certainly possible, including a hardware implementation or a software/hardware implementation. Any hardware-implemented functions may be realized using application specific integrated circuits ASIC(s), digital signal processing circuitry, field programmable gate arrays (FPGA), programmable logic devices (PLD), or the like. Accordingly, any "means" terms in the claims are intended to cover both software and hardware implementations. Similarly, the term "machine-readable medium" as used herein includes software, hardware having a program of instructions hardwired thereon, or a combination thereof. With these implementation alternatives in mind, it is to be understood that the figures and accompanying description provide the functional information one skilled in the art would require to write program code (i.e., software) or to fabricate circuits (i.e., hardware) to perform the processing required.

In accordance with further aspects of the invention, any of the above-described methods or steps thereof may be embodied in a program of instructions (e.g., software), which may be stored on, or conveyed to, a computer or other processor-controlled device for execution. Alternatively, any of the methods or steps thereof may be implemented using functionally equivalent hardware (e.g., application specific integrated circuit (ASIC), digital signal processing circuitry, etc.) or a combination of software and hardware.

It should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, such as a carrier network, or it may be a general purpose computer selectively activated or configured by a computer program stored in the computer or on a computer readable medium. In particular, various general purpose machines may be used with computer programs written in accordance with the teachings herein, or it may be more convenient to construct a more specialized apparatus to perform the required operations.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network or a backplane.

The invention can also be embodied as computer readable code on a tangible computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A computer-readable medium encoded with instructions for a processor to perform a method for simulating a final pattern of a droplet of a fluid, comprising:
   instructions for using lubrication equations that describe behavior of the droplet on a non-flat substrate;
   instructions for using the lubrication equations to represent diffusion in the droplet and evaporation of the droplet;
   instructions for solving the lubrication equations through temporal discretization and spatial discretization;
   instructions for deriving the final pattern of the droplet from results from solving the lubrication equations; and
   instructions for storing the final pattern,
   wherein evaporation in the droplet is calculated using a first high order differential function that is representative of the behavior of a height of the droplet over time, wherein a first function is equated to a second function, the first function being representative of a temporal derivative of a height (H) of the droplet above a plane, and the second function including a first term that is a function of the height (H-f) of the droplet above the substrate (f); and a Laplacian of the height ($\nabla^2 H$) of the droplet above the plane.

2. The computer-readable medium of claim 1, wherein the lubrication equations also represent diffusion of a solute in a solvent.

3. The computer-readable medium of claim 1, further comprising:
instructions for characterizing the droplet as axi-symmetric.

4. The computer-readable medium of claim 1, wherein the solving the lubrication equations is achieved through a central difference expression.

5. The computer-readable medium of claim 1, wherein the second function includes a second term that is representative of the evaporation rate of the droplet.

6. A system, including the computer-readable medium and processor of claim 1 for performing the instructions recited in claim 1.

7. A computer-readable medium encoded with instructions for a processor to perform a method for simulating a final pattern of a droplet of a fluid, comprising:
instructions for using lubrication equations that describe behavior of the droplet on a non-flat substrate;
instructions for using the lubrication equations to represent diffusion in the droplet and evaporation of the droplet;
instructions for solving the lubrication equations through temporal discretization and spatial discretization
instructions for deriving the final pattern of the droplet from results from solving the lubrication equations; and
instructions for storing the final pattern,
wherein the diffusion in the droplet is calculated using a second high order differential function that is representative of the behavior of a concentration (C) of solute in the droplet, wherein
a temporal derivative of the product of a height of the droplet above the substrate and the concentration ((H-f) C) is equated to a sum of a third function and a fourth function;
the third function is a differential function of a product of:
the concentration (C);
the height of the droplet above the substrate (H-f); and
a third high order differential function of the height of the droplet (H) above a plane; and the fourth function is a differential function of a product of:
a differential function of the concentration (C); and
the height of the droplet above the substrate (H-f).

8. A system, including the computer-readable medium and processor of claim 7, for performing the instructions recited in claim 7.

9. A computer-readable medium encoded with instructions for a processor to perform a method for simulating the evolution of a height of an evaporating droplet comprising:
generating a height function that is representative of the height (H) of the droplet above a plane at a first point in time at a plurality of points in a simulation space;
generating a first differential function that describes a proportional relationship between an intermediate variable and a Laplacian of the height function ($\nabla^2 H$);
generating a second differential function that comprises:
a first term that is a partial derivative of the height (H) function with respect to time;
a second term that is proportional to the evaporation rate (J) of the droplet; and
a third term that is a third function of the height function (H), a height of a non-flat substrate (f) on which the droplet is located, and the intermediate variable; and
determining the height function at a second point in time by finding an approximate solution that satisfies both the first differential function and the second differential function.

10. The computer-readable medium of claim 9, wherein the third function is a divergence of a fourth function of the height and the intermediate variable.

11. The computer-readable medium of claim 10, wherein the fourth function is proportional to the cube of the difference between the height function and a height of a non-flat substrate (H-f).

12. The computer-readable medium of claim 10, wherein the fourth function is proportional to the gradient of the intermediate variable.

13. The computer-readable medium of claim 9, wherein the evaporation rate (J) of the droplet is a function of space and time.

14. A system, including the computer-readable medium and processor of claim 9, for performing the instructions recited in claim 9.

* * * * *